US010848059B1

(12) United States Patent
Muralidharan et al.

(10) Patent No.: US 10,848,059 B1
(45) Date of Patent: Nov. 24, 2020

(54) SYSTEMS AND METHODS INVOLVING CHARGE PUMPS COUPLED WITH EXTERNAL PUMP CAPACITORS AND OTHER CIRCUITRY

(71) Applicant: Micron Technology, Inc., Boise, ID (US)

(72) Inventors: Arvind Muralidharan, Folsom, CA (US); Hari Giduturi, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/677,514

(22) Filed: Nov. 7, 2019

(51) Int. Cl.
*H02M 3/07* (2006.01)
*H02M 1/32* (2007.01)

(52) U.S. Cl.
CPC .............. *H02M 3/07* (2013.01); *H02M 1/32* (2013.01)

(58) Field of Classification Search
None
See application file for complete search history.

(56) References Cited

U.S. PATENT DOCUMENTS

| | | | |
|---|---|---|---|
| 5,392,205 A * | 2/1995 | Zavaleta | H02M 3/07 323/285 |
| 6,107,862 A * | 8/2000 | Mukainakano | H02M 3/07 327/536 |
| 6,434,044 B1 * | 8/2002 | Gongwer | G11C 5/14 365/185.11 |
| 7,385,869 B2 * | 6/2008 | Ishikawa | G11C 5/14 365/185.18 |
| 7,511,564 B2 * | 3/2009 | Tahata | H02M 3/07 327/536 |
| 7,675,802 B2 * | 3/2010 | Kagan | G11C 5/147 365/189.08 |
| 8,344,791 B2 * | 1/2013 | Adkins | H02M 3/07 327/536 |
| 8,629,935 B2 * | 1/2014 | Kikuchi | H04N 5/23241 348/241 |
| 8,755,242 B2 * | 6/2014 | Lee | H02M 1/15 365/226 |
| 8,836,412 B2 * | 9/2014 | Wang | G11C 5/145 327/534 |
| 9,007,844 B2 * | 4/2015 | Castagna | G11C 16/30 365/185.23 |
| 9,385,600 B2 * | 7/2016 | Torres | H02M 3/158 |
| 9,425,685 B2 * | 8/2016 | Philip | H02M 3/07 |
| 10,534,738 B2 * | 1/2020 | Ranjan | G06F 13/4068 |

(Continued)

*Primary Examiner* — Jeffery S Zweizig
(74) *Attorney, Agent, or Firm* — Greenberg Traurig

(57) ABSTRACT

Systems and methods of memory operation involving charge pump circuitry located on a die and coupled to external pump capacitors are disclosed. In one embodiment, an exemplary system may comprise a memory die containing a memory array and charge pump circuitry configured to generate a pump voltage supplied to the memory array, and one or more pump capacitors located external to the die and configured to hold stored charge that is used to generate the pump voltage. Some embodiments may include a tank capacitor, also located off-die, to condition the charge provided from the pump capacitor. According to further embodiments, the charge pump circuitry may include one or both of max current control circuitry and/or switch resistance control circuitry that may be utilized, for example, to adjust peak current.

29 Claims, 5 Drawing Sheets

(56) References Cited

U.S. PATENT DOCUMENTS

| | | | | |
|---|---|---|---|---|
| 2008/0122505 A1* | 5/2008 | Wu | ............ | H02M 3/07 327/157 |
| 2016/0033988 A1* | 2/2016 | Voorwinden | ............ | H02M 3/07 323/300 |
| 2017/0054363 A1* | 2/2017 | Mangtani | ............ | H02M 3/07 |

* cited by examiner

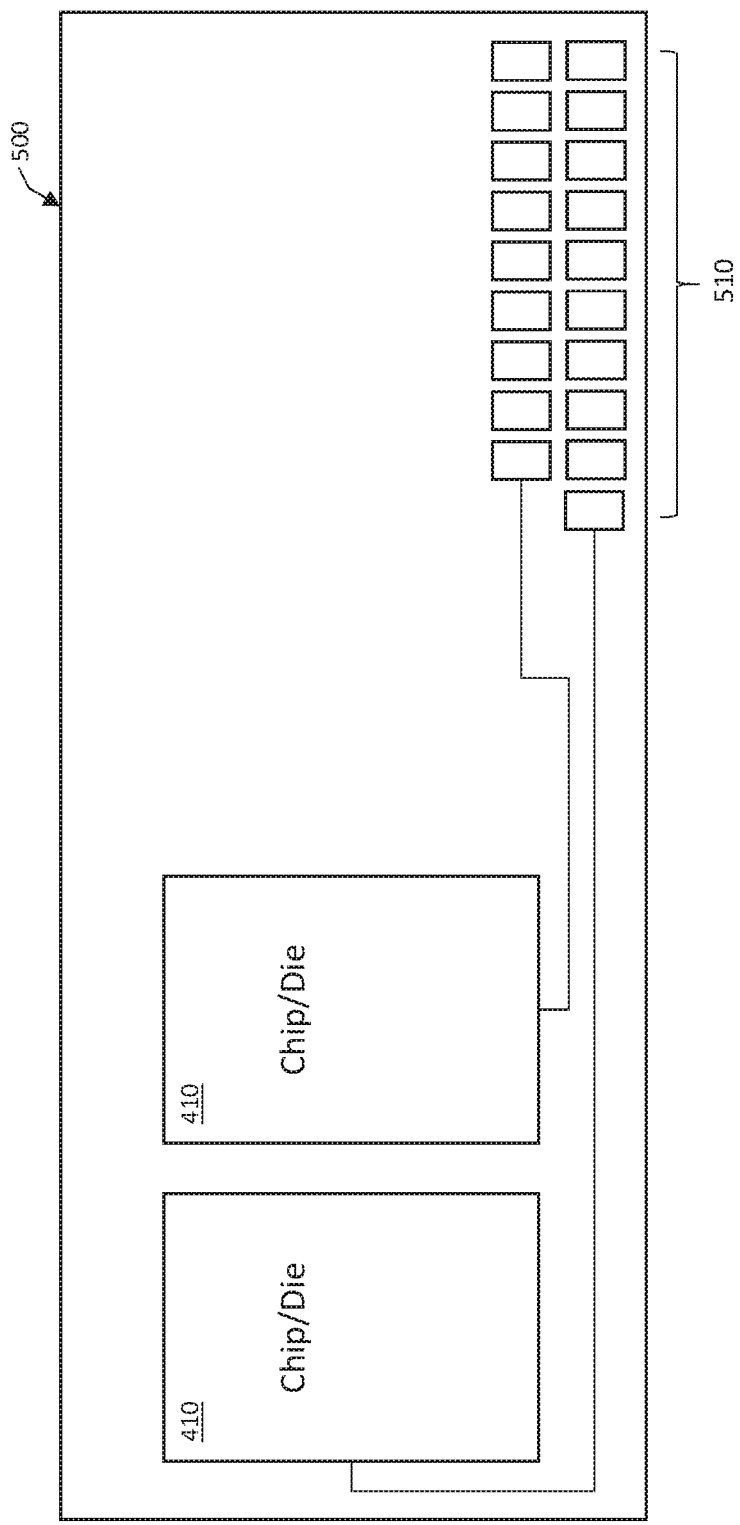

SYSTEMS AND METHODS INVOLVING CHARGE PUMPS COUPLED WITH EXTERNAL PUMP CAPACITORS AND OTHER CIRCUITRY

TECHNICAL FIELD

The present disclosure relates generally to semiconductor memory, and more particularly, to systems and methods associated with charge pumps implemented with external pump capacitors and other, associated circuitry.

BACKGROUND

Integrated circuit devices traverse a broad range of electronic devices including memory devices, which are often referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Integrated circuits often require supply voltages of greater potential than that provided by an external voltage source. Memory circuits such as dynamic random access memories (DRAMs) require higher internal voltages to pre-charge memory word lines and the like. Integrated circuits which are used in systems dependent upon a limited external power supply, such as a battery, must generate the additional supply voltages using conversion circuitry. Charge pumps are known in the art as on-chip voltage generators capable of providing a voltage more positive than the most positive external supply or more negative than the most negative external supply. Certain charge pumps, such as those acting as capacitor-based DC-to-DC converters, are commonly utilized for step-up DC-to-DC conversion used in memory technologies, including NAND, NOR, and other memory technologies.

Further, new generation integrated circuits, such as those used in densely populated devices like portable computers and phones, require low voltage operation and reduced power consumption. However, energy efficiency of charge pumps is often plagued by issues such as parasitic capacitance stemming from capacitors being implemented in silicon or metal, i.e., on die. For example, capacitors realized on silicon are usually NMOS/PMOS devices on substrate and/ or metal capacitors, which have large parasitic capacitance to substrate or other nodes. This parasitic capacitance can result in substantial energy loss during pumping operation.

The disclosed embodiments provide improved technical solutions regarding the above-noted drawbacks and/or otherwise remedy or overcome the above and other deficiencies of existing semiconductor memories.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

FIG. 5 illustrates a simplified block diagram of an exemplary memory package of a memory system, according to some embodiments of the disclosure.

DETAILED DESCRIPTION

Figure 1:
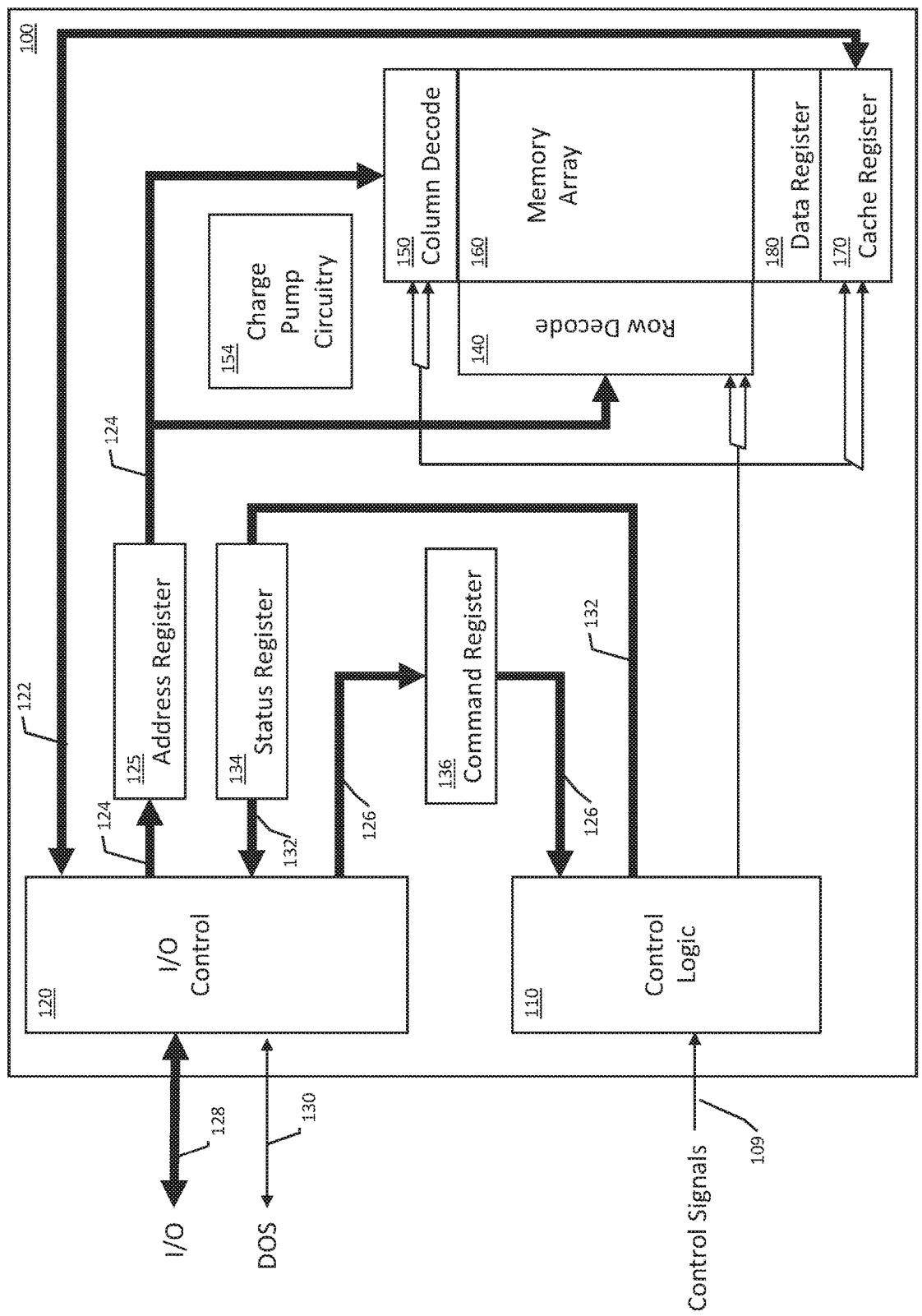
FIG. 1 illustrates a simplified block diagram of a memory device, according to some embodiments of the disclosure.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

Systems and methods of memory operation involving charge pump circuitry located on a die and coupled to external pump capacitors are disclosed. According to embodiments herein, pump capacitors may be implemented off-chip or off-die while keeping charge pump switches located on-die to minimize current/energy loss during charge pump operation. In one implementation, for example, a system may comprise a memory die containing a memory array and charge pump circuitry configured to provide a pump voltage supplied to the memory array, and one or more pump capacitors located external to the die and configured to hold stored charge that is used to generate the pump voltage. Some embodiments may also include a tank capacitor, also located off-die, to condition the charge provided from the pump capacitor(s). According to further embodiments, charge pump circuitry herein may include one or both of max current control circuitry and/or switch resistance control circuitry that are utilized, for example, to adjust peak current.

As set forth in more detail, below, external pump capacitors located off-die or off-chip may be utilized by charge pump circuitry on the die or chip to provide high efficiency DC-to-DC conversion. The example embodiments described, below, relate to single-stage positive charge pumps involving one or more external pump capacitors coupled to the die or chip via bond pads. While embodiments herein are discussed referring to this one exemplary memory technology, it should be understood that the concepts disclosed herein may also be applied to other forms of semiconductor memories and charge pump technologies. Further, in some embodiments, the charge pump output may be shared between different dice in a package or system.

FIG. 1 illustrates a simplified block diagram of a memory device 100, according to some embodiments of the disclosure. The memory device 100 may include a memory array 160 with a plurality of memory cells that are configured to store data. The memory cells may be accessed in the array through the use of various signal lines, for example, global word lines (GWLs), local word lines (LWLs), and bitlines (BLs). The memory cells may be non-volatile memory cells, such as NAND or NOR flash cells, phase change memory cells, or may generally be any type of memory cells. The memory cells may be single level cells configured to store data for one bit of data. The memory cells may also be multi-level cells configured to store data for more than one bit of data.

Commands, address information, and write data may be provided to the memory device 100 as sets of sequential input/output (I/O) transmitted through an I/O bus 128. Similarly, read data may be provided from the memory device 100 through the I/O bus 128. A data strobe signal DQS may be transmitted through a data strobe bus 130. The DQS signal may be used to provide timing information for the transfer of data to the memory or from the memory. The I/O bus 128 is connected to an I/O control circuit 120 that routes data signals, address information signals, and other signals between the I/O bus 128 and an internal data bus 122, an internal address bus 124, and an internal command bus 126. An address register 125 may be provided address information by the I/O control circuit 120 to be temporarily stored. The I/O control circuit 120 is coupled to a status register 134 through a status register bus 132. Status bits stored by the status register 134 may be provided by the I/O control circuit 120 responsive to a read status command provided to the memory device 100. The status bits may have respective values to indicate a status condition of various aspects of the memory and its operation.

The memory device 100 may also include control logic 110 that receives a number of control signals 109 or through the command bus 126 to control the operation of the memory device 100. A command register 136 is coupled to the internal command bus 126 to store information received by the I/O control circuit 120 and provide the information to the control logic 110. The control logic 110 may further access a status register 134 through the status register bus 132, for example, to update the status bits as status conditions change. The control logic 110 may be further coupled to a ready/busy circuit (not shown) to control a value (e.g., logic value) of a ready/busy signal R/B # that may be provided by the memory device 100 to indicate whether the memory is ready for an operation or is busy. The control logic 110 may be configured to provide internal control signals to various circuits of the memory device 100. For example, responsive to receiving a memory access command (e.g., read, write, program), the control logic 110 may provide internal control signals to control various memory access circuits to perform a memory access operation. The various memory access circuits are used during the memory access operation, and may generally include circuits such as row and column decoders, charge pump circuits, signal line drivers, data and cache registers, I/O circuits, as well as others.

The address register 125 provides block-row address signals to a row decoder 140 and column address signals to a column decoder 150. The row decoder 140 and column decoder 150 may be used to select blocks of memory cells for memory operations, for example, read, program, and erase operations. The row decoder 140 and/or the column decoder 150 may include one or more signal line drivers configured to provide a biasing signal to one or more of the signal lines in the memory array 160. The signal line drivers may drive the signal lines with a pumped voltage that is provided by charge pump circuitry 154. The charge pump circuitry 154 may provide different voltages used during operation of the memory device 100, for example, during memory access operations. The voltages provided by the charge pump circuitry 154 may include voltages that are greater than a power supply voltage provided to the memory device 100, voltages that are less than a reference voltage (e.g., ground) provided to the memory device 100, as well as other voltages as well. Various implementations of charge pump circuitry 154 consistent with the disclosed technology are set forth below in connection with FIGS. 3 and 4.

Figure 2:
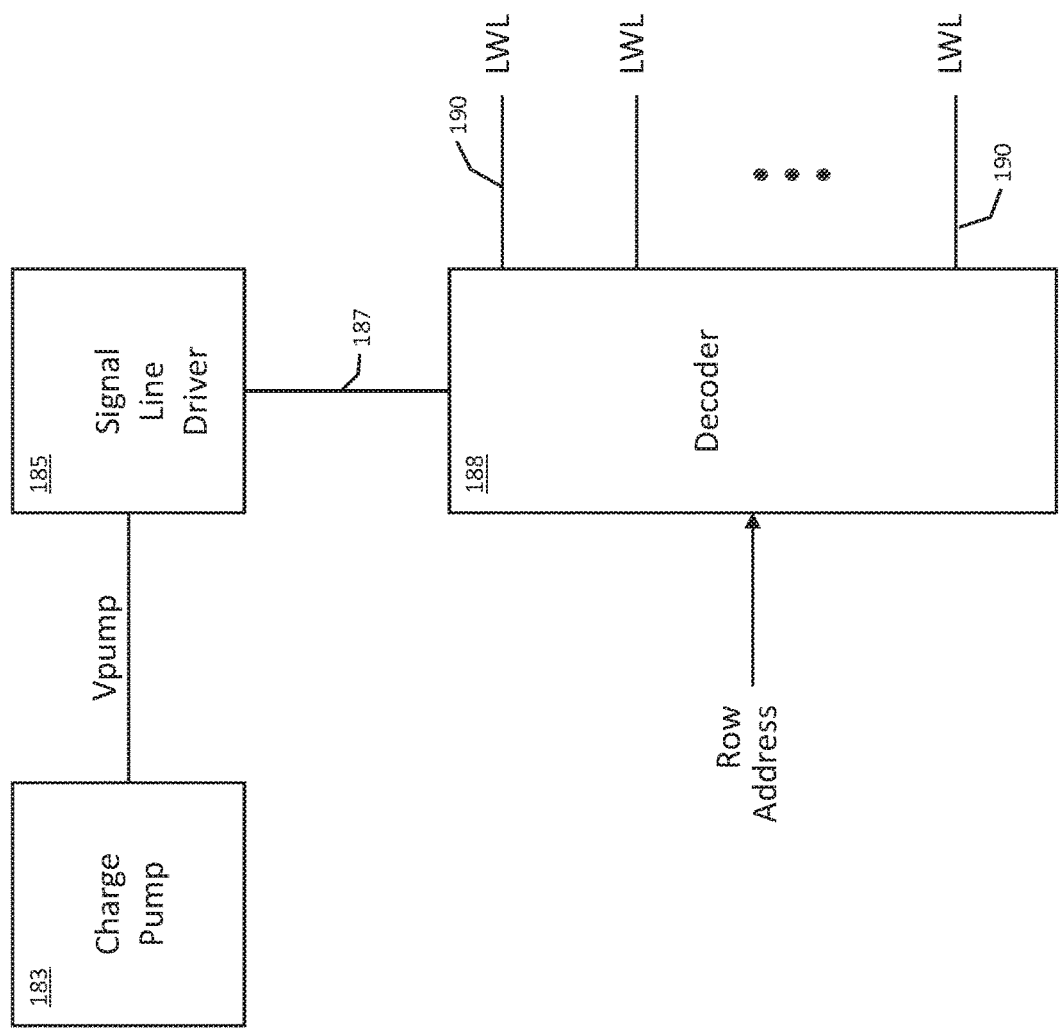
FIG. 2 illustrates a portion of an exemplary memory device, according to some embodiments of the disclosure.

FIG. 2 illustrates a portion of an exemplary memory device 100, according to some embodiments of the disclosure. In particular, FIG. 2 illustrates an arrangement of a signal line driver 185 such as a global word line (GWL) driver, a global signal line 187 such as a global word line (GWL), a decoder 188 such as a local word line decoder, and local signal lines 190 such as local word lines (LWLs). A charge pump circuit 183, for example, included in charge pump circuitry 154 of FIG. 1, may be coupled to provide a pump voltage, for example, a global signal line voltage such as a global word line voltage ($V_{GWL}$), to the global signal line driver 185. In some embodiments, the global signal line driver 185 and the local signal line decoder 188 may be included in the row decoder 140. The global signal lines 187 (as well as others) and the local signal lines 190 may extend through the memory array 160, and as previously discussed, may be used to access the memory cells of the memory array 160. During a memory access operation, the charge pump circuit 183 provides the global signal line voltage to the global signal line driver 185, which is configured to drive the global signal line(s) 187 with this voltage (e.g., $V_{GWL}$). The global signal line(s) 187 provide such $V_{GWL}$ voltage to the local signal line decoder 188, which, based on row address signals, transfers the voltage of the global signal line 187 to one or more of the local signal lines 190 associated with the memory address of the memory access operation. It will be appreciated while FIG. 2 illustrates one global signal line driver, one global signal line, one local signal line decoder and a plurality of local signal lines, that the memory device 100 may include additional such elements.

For a program operation, after the row address signals have been applied to the address bus 124, the I/O control circuit 120 routes write data signals to a cache register 170. The write data signals are stored in the cache register 170 in successive sets each having a size corresponding to the width of the I/O bus 128. The cache register 170 sequentially stores the sets of write data signals for an entire row or page of memory cells in the array 160. All of the stored write data signals are then used to program a row or page of memory cells in the array 160 selected by the block-row address coupled through the address bus 124. In a similar manner, during a read operation, data signals from a row or block of memory cells selected by the block-row address coupled through the address bus 124 are stored in a data register 180. The data register 180 and the cache register 170 may act as a single register for some page operations. For example, data stored in the data register 180 may be also stored in the cache register 170. Sets of data signals corresponding in size to the width of the I/O bus 128 are then sequentially transferred through the I/O control circuit 120 from the data register 180 and/or the cache register 170 to the I/O bus 128.

Figure 3:
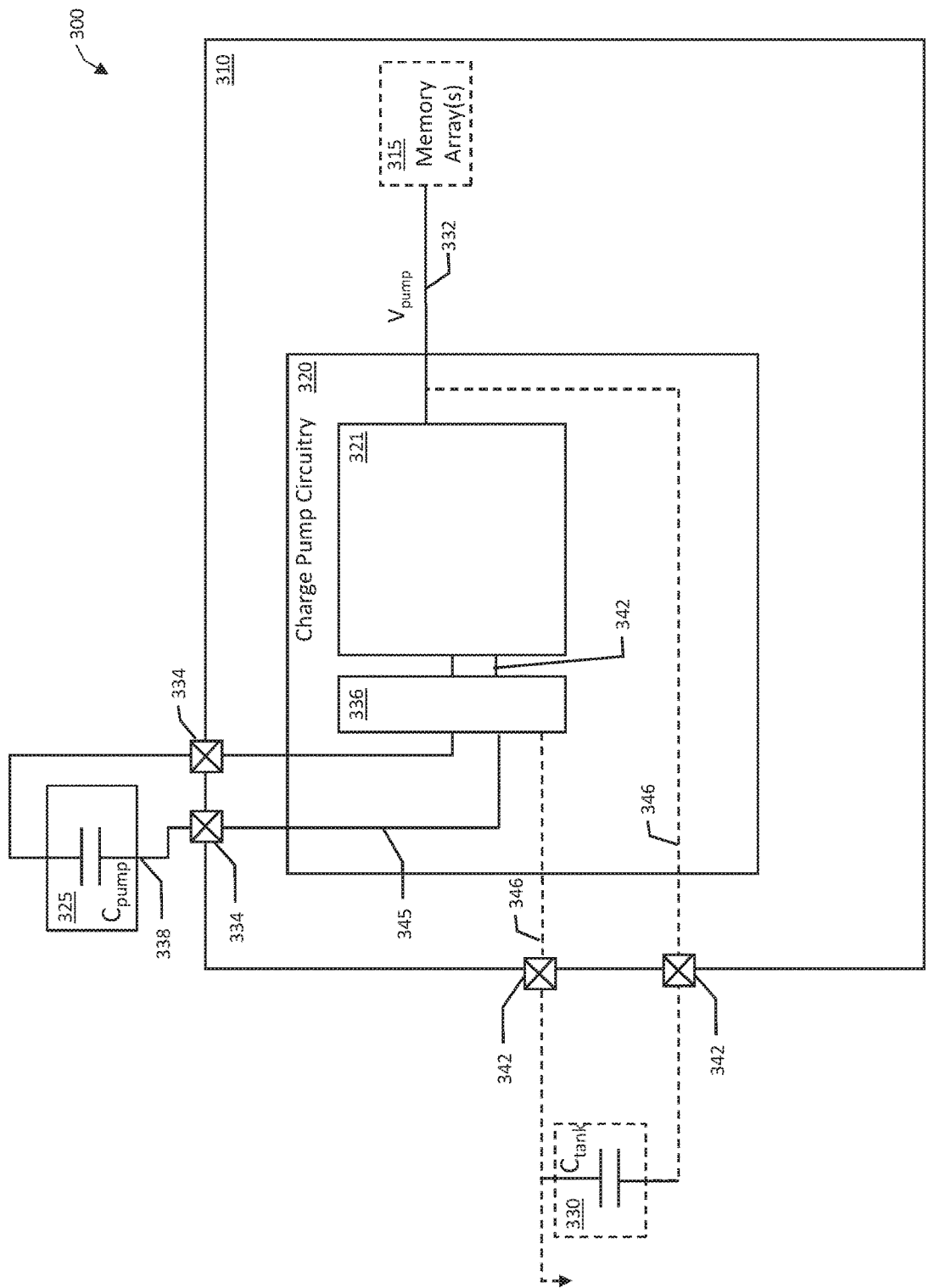
FIG. 3 illustrates a block diagram of an exemplary memory system focusing on the charge pump components, according to some embodiments of the disclosure.

FIG. 3 illustrates a block diagram of an exemplary memory system, according to some embodiments of the disclosure. Referring to FIG. 3, an exemplary memory system 300 may comprise a memory die 310 or chip containing one or more memory arrays 315, charge pump circuitry 320 including charge pump regulation circuitry 321 and switching circuitry 336, one or more pump capacitors 325 located external to the die 310, and, optionally, one or more tank or ripple capacitors 330. It is noted that the exemplary memory system 300 can utilize either positive voltage charge pump circuitry or negative voltage charge pump circuitry. The charge pump circuitry 320 may be configured to generate a pump voltage 332 that is provided as output for charging memory cells of the memory array 315. The one or more pump capacitors 325, Cpump, are located external to the die 310 and configured to hold stored charge that is used to generate the pump voltage 332. In some embodiments, the one or more pump capacitors 325 may be implemented using technologies having very little parasitic capacitance, such as via ceramic capacitors, as compared to capacitors fabricated on die or metal capacitors. Further, the one or more pump capacitors 325 may be electrically coupled to the charge pump circuitry by bond pads 334 of the die 310. Within the die 310, the charge being provided to the charge pump circuitry from the pump capacitors 325 may be controlled by the switching circuitry 336 including switches which are fabricated on the die 310 to minimize current/energy loss during pump operation.

According to first embodiments, a second node 338 associated with the pump capacitors 325 may be coupled to the switching circuitry 336, e.g. by wiring 345 on the die, without inclusion of any external tank capacitor(s) 330.

According to second embodiments, at least one tank capacitor 330, also located off-die, may be provided to condition the charge provided from the pump capacitor 325. In some implementations, for example, tank capacitor(s) 330 may be included to reduce the pump's ripple voltage and/or regulate other output voltage variation of the charge provided by the pump capacitors, as demanded by the application for which the charge pump is being used. Such reduction of ripple voltage helps reduce unwanted effects stemming from charge injection from the pump and/or regulator characteristics. In such second embodiments, the tank capacitor(s) 330 are also coupled between Vpump 332 (via bond pad 342 of the die) and the ground node. Further, the tank capacitors 330 may be fabricated off-die using one or more capacitor technologies that are not subject to large parasitic capacitance problems between the capacitors and the substrate or nodes, such as ceramic capacitors. This avoids negative parasitic capacitance effects such as energy loss that would otherwise occur during pumping operation(s).

Moreover, according to some embodiments, the charge pump circuitry (i.e., 320 in FIG. 3 as well as that of FIG. 4 and described elsewhere herein) is configured to generate multiple pump voltages simultaneously, the multiple pump voltages being used to charge memory cells of the one or more memory arrays. Further, in some aspects, the multiple pump voltages may be comprised of positive and/or negative pump voltages.

Figure 4:
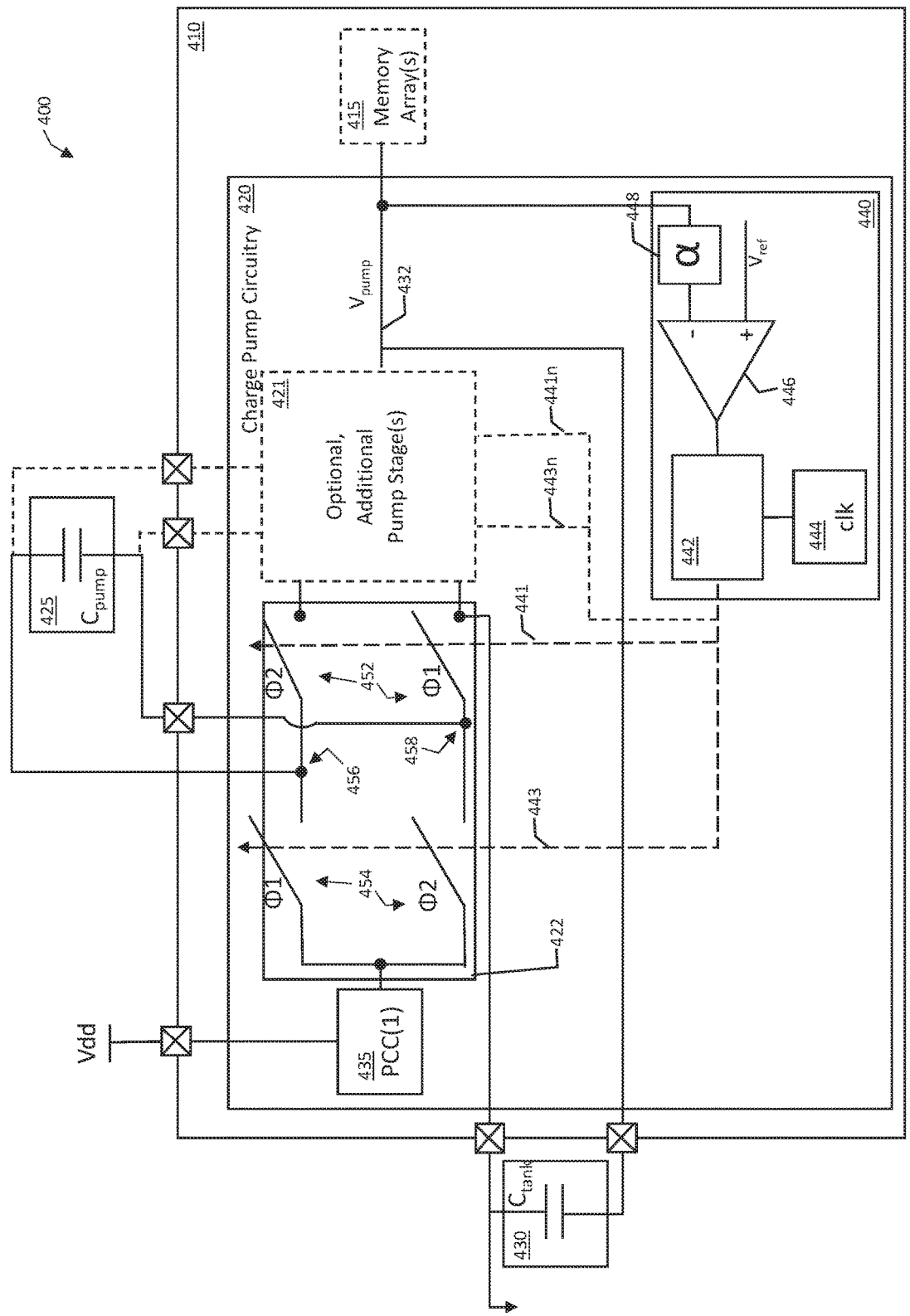
FIG. 4 illustrates a block diagram of an exemplary memory system including additional details of charge pump architecture and components, according to some embodiments of the disclosure.

FIG. 4 illustrates a block diagram of another exemplary memory system with a positive charge pump, according to some embodiments of the disclosure. Referring to FIG. 4, the exemplary memory system 400 shown may comprise a memory die 410 or chip containing one or more memory arrays 415, charge pump circuitry 420 including a first pump stage 422, optionally, one or more additional pump stages 421, and one or more pump capacitors 425 located external to the die 410. The example memory system 400 of FIG. 4 may also include one or more optional components including one or more tank or ripple capacitors 430 located external to the die 410, max current control circuitry 435, and/or regulation and peak current control circuitry 440. In some optional embodiments, additional pump stages 421 may be included, each being provided charge from the pump capacitors 425 through bond pads. Example memory system 400 may also include first switches 452 on the die coupled between the pump capacitors 425 and circuitry of the first pump stage 422 and/or second switches 454 coupled to the max current control circuitry 435 and which may also be coupled across a pair of nodes 456/458, within the charge pump circuitry on the die, to which charge from the pump capacitors 425 is provided.

As with the example embodiment of FIG. 3, the charge pump circuitry 420 may be configured to generate a pump voltage 432 that is provided as output for charging memory cells of the memory array 415. Similarly, the one or more pump capacitors 425, Cpump, are located external to the die 410 and configured to hold stored charge that is used to generate the pump voltage 432. In some embodiments, the one or more pump capacitors 425 may be implemented using technologies having very little parasitic capacitance, such as via ceramic capacitors, as compared to capacitors fabricated on die (e.g., silicon capacitors, etc.) or metal capacitors. Further, the one or more pump capacitors 425 may be electrically coupled to the charge pump circuitry by bond pads of the die 410. On the die 410, the charge being provided to the charge pump circuitry 420 from the pump capacitors 425 may be controlled by switching circuitry including switches that are fabricated on the die 410 to minimize current/energy loss during charge pump operation.

Turning to the regulation and peak current control circuitry 440, in the one example embodiment shown in FIG. 4, some regulation circuitry (e.g. 446) is shown outside of the pulse control circuitry 442, though the individual circuitry may be arranged in various ways without departing from the innovations herein. According to various embodiments, the pulse control circuitry 442 may include pulse frequency modulation circuitry, pulse height control circuitry, and/or circuitry utilizing other modulation techniques. In the exemplary feedback loop arrangement shown, the pump voltage 432 may be provided as a first input (e.g., via multiplier 448) of a comparator 446, with the second input of the comparator being a reference voltage, Vref. Vref may be generated inside of the pump circuitry itself, or it may be generated locally, or it may be generated off-die. The output of the comparator 446 and a clock signal 444 may be provided as inputs to the pulse control circuitry 442, which may be configured to provide a first control signal 441 to the first switches 452 and/or a second control signal 443 to the second switches 454. Here, given such circuit arrangement, when a desired current or current limit such as a peak current limit is established, the regulation and peak current control circuitry 440 may calibrate or set circuit conditions, such as resistance, to provide one or both of the first control signal 441 and the second control signal 443 to adjust the amount of charge being provided from the pump capacitors 425 and/or Vdd supply, e.g., by setting the pump switch strength, and thereby adjusting the charge pump's input current. Such adjustment, control or limit of the pump input current may be implemented by controlling charge present on and/or passed through the nodes 456/458, e.g., by controlling switches or other switch/control circuitry located at 452 and/or 454.

Turning to the max current control circuitry 435, in the one example embodiment shown in FIG. 4, such circuitry may be located on the die and coupled via switches 454 to nodes (both also on die), such as nodes 456/458, at which charge being supplied by the pump capacitors 425 onto the die 410 is provided. The max current control circuit may be coupled via a bond pad to the supply voltage, Vdd. In some embodiments, such as those including the regulation and peak current control circuitry 440 described above, the switches or switch/control circuitry at 454 may be coupled to a second control signal 443 being output from the regulation and peak current control circuitry 440. In other embodiments, the system may include switches and/or switch/control circuitry at 454 associated with the max current control circuitry 435, e.g., that are utilized to control the charge and/or current present at nodes 456/458 and thereby set, adjust or limit current, such as a peak current, provided to or from the charge pump circuitry 420.

Accordingly, by inclusion of one or both of the max current control circuitry 435 and/or the regulation and peak current control circuitry 440, current provided to or from the charge pump circuitry 420, such as peak current, may be adjusted, trimmed or limited. In some embodiments, such current may also be tuned, i.e., adjusted, trimmed or limited, based on requirements of the memory system. Here, for example, requirements of the memory system that may be utilized as factors for tuning the current include one or more of the current capability of the power supply unit and/or the current requirements of other components such as the memory controller and other memory/non-memory chips supplied by the power supply unit.

It is noted that one or both of the peak current control circuitry 440 and the max current control circuitry 435 may be positioned inside or outside of the charge pump circuitry 420, structurally and/or logically.

FIG. 5 illustrates a simplified block diagram of an exemplary memory package 500 of a memory system, according to some embodiments of the disclosure. Referring to FIG. 5, one example memory package 500 is disclosed, with the memory package 500 including one or more memory chips or dice 410 that are electrically coupled to one or more external capacitors 510, which may be pump capacitors 425 and/or tank capacitors 430. Further, in some multi-die package/system embodiments, one or more dice can implement the charge pump as shown herein while the rest can directly use the voltage generated by other dice. This reduces the number of capacitors that need to be included at a system level.

Further, the subject matter disclosed above may be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Those skilled in the art will recognize that the methods and devices of the present disclosure may be implemented in many manners and as such are not to be limited by the foregoing exemplary embodiments and examples. In other words, aspects/elements can be performed by single or multiple components, in various combinations and/or sub-combinations, and individual aspects, may be distributed among components and/or subcomponents. In this regard, any number of the features of the different embodiments described herein may be combined into single or multiple embodiments, and alternate embodiments having fewer than, or more than, all the features described herein are possible.

While various embodiments have been described for purposes of this disclosure, such embodiments should not be deemed to limit the teaching of this disclosure to those embodiments. Various changes and modifications may be made to the elements and features described above to obtain a result that remains within the scope of the systems and processes described in this disclosure.

The invention claimed is:

1. A system comprising:
   a memory die comprising:
   (i) one or more memory arrays; and
   (ii) charge pump circuitry including charge pump switches, the charge pump circuitry being configured to provide a pump voltage supplied to one or more signal line drivers associated with the one or more memory arrays, the pump voltage being used to charge memory cells of the one or more memory arrays; and
   one or more pump capacitors located external to the die and configured to hold stored charge that is used to generate the pump voltage, wherein the one or more pump capacitors are electrically connected to the charge pump circuitry via bond pads of the die;

regulation and peak current control circuitry coupled to the charge pump circuitry and configured to calibrate an adjustable amount of charge supplied to the charge pump circuitry from the one or more pump capacitors;

wherein the regulation and peak current control circuitry is electrically connected to a control circuit positioned between the one or more pump capacitors and the charge pump circuitry;

wherein the regulation and peak current control circuitry is configured to modulate resistance of the charge pump switches and thereby adjust a current or limit a peak current drawn from the one or more pump capacitors through the bond pads;

wherein the charge pump switches are arranged to control supply of the stored charge from the pump capacitors to the charge pump circuitry for generating the pump voltage.

2. The system of claim 1 wherein the one or more pump capacitors comprise at least one ceramic capacitor.

3. The system of claim 1 wherein the pump voltage is shared between different dice in a memory package.

4. The system of claim 1 further comprising:
one or more tank capacitors located external to the die and coupled to the charge pump circuitry to reduce one or both of ripple voltage and/or other output voltage variation.

5. The system of claim 1 further comprising:
a max current control circuit electrically coupled to the charge pump circuitry and configured to adjust or limit a current of the charge pump circuitry.

6. The system of claim 5 wherein the max current control circuit is electrically connected to nodes associated with the bond pads to which the one or more pump capacitors and/or switches are coupled.

7. The system of claim 1 further comprising:
a max current control circuit electrically coupled to the charge pump circuitry and configured to adjust or limit a peak current of the charge pump circuitry.

8. The system of claim 7 wherein the max current control circuit is electrically connected to nodes associated with the bond pads to which the one or more pump capacitors are coupled.

9. The system of claim 7 wherein the peak current is trimmable, via one or both of the max current control circuit and/or the switch resistance control circuit, to adjust the peak current based on requirements of the system.

10. The system of claim 1 wherein a peak current provided by the charge pump circuitry is trimmable, such that the peak current may be adjusted or tuned to requirements of the system.

11. The system of claim 1 wherein the charge pump circuitry is configured to generate multiple pump voltages simultaneously, the pump voltages being used to charge memory cells of the one or more memory arrays.

12. The system of claim 11 wherein the multiple pump voltages comprise at least one positive pump voltage and/or at least one negative pump voltage.

13. The system of claim 1 further comprising:
a max current control circuit electrically coupled to the charge pump circuitry and configured to adjust a current of the charge pump circuitry.

14. The system of claim 13 wherein the peak current is trimmable via the max current control circuit.

15. A method of operating a memory system, the method comprising:
operating charge pump circuitry located in a first region of a memory package to generate a pump voltage used for charging memory cells of one or more memory arrays, wherein the first region is on-die with the one or more memory arrays;

activating, via switches of the charge pump circuitry located on the die, one or more pump capacitors that contain charge used to generate the pump voltage, the one or more pump capacitors being located in a second region of the memory package that is external to the die;

transferring, via wiring coupling the one or more pump capacitors in the second region to the charge pump circuitry in the first region, the charge from the one or more pump capacitors to the charge pump circuitry;

calibrating, via regulation and peak current control circuitry coupled to the charge pump circuitry, an adjustable amount of charge supplied to the charge pump circuitry from the one or more pump capacitors;

wherein the regulation and peak current control circuitry is electrically connected to a control circuit positioned between the one or more pump capacitors and the charge pump circuitry;

wherein the regulation and peak current control circuitry is configured to modulate resistance of the charge pump switches and thereby adjust the current drawn from the one or more pump capacitors; and generating, by the charge pump circuitry, the pump voltage using the charge transferred from the one or more pump capacitors;

wherein the pump voltage is generated without loss stemming from parasitic capacitance between the one or more pump capacitors and a substrate material or one or more nodes of the die.

16. The method of claim 15 wherein the one or more pump capacitors comprise at least one ceramic capacitor.

17. The method of claim 15 further comprising:
providing the pump voltage to a plurality of different dice in the memory package.

18. The method of claim 15 wherein the charge transferred from the one or more pump capacitors to the charge pump circuitry is transferred via one or more tank capacitors located external to the die, to reduce one or both of ripple voltage and/or other output voltage variation of the charge delivered to the charge pump circuitry.

19. The method of claim 18 wherein the charge is transferred by the wiring to the die via switches on the die, then coupled through the one or more tank capacitors located external to the die conditioning, and then provided to the output of the charge pump circuitry to reduce one or both of ripple current and/or other output voltage variation of the charge.

20. The method of claim 15 further comprising:
adjusting a peak current of the pump voltage generated by the charge pump circuitry based on requirements of the memory system.

21. The method of claim 15 further comprising:
adjusting, by a max current control circuit electrically coupled to the charge pump circuitry, a peak current of the pump voltage generated by the charge pump circuitry.

22. The method of claim 21 wherein the peak current is adjusted or limited via control of the max current control circuit, which is electrically connected to nodes on the die to which the one or more pump capacitors are coupled.

23. The method of claim 15 further comprising:
adjusting, by switch resistance control circuitry coupled to the charge pump circuitry, a peak current of the pump voltage generated by the charge pump circuitry.

24. The method of claim 23 further comprising:
changing resistance associated with the switch resistance control circuitry to adjust the peak current of the pump voltage, the switch resistance control circuitry being electrically connected to and operating the control circuit positioned between the one or more pump capacitors and the charge pump circuitry to adjust the peak current.

25. The method of claim 23 further comprising:
adjusting, by a max current control circuit electrically coupled to the charge pump circuitry, a peak current of the pump voltage generated by the charge pump circuitry.

26. The method of claim 25 wherein the peak current is adjusted via control of the max current control circuit, which is electrically connected to nodes on the die to which the one or more pump capacitors are coupled.

27. The method of claim 25 further comprising:
adjusting, via one or both of the max current control circuit and/or the switch resistance control circuit, the peak current based on requirements of the memory system.

28. The method of claim 15 further comprising:
generating, by the charge pump circuitry, multiple pump voltages simultaneously; and
charging memory cells of the one or more memory arrays using the multiple pump voltages.

29. The method of claim 28 wherein the multiple pump voltages comprise at least one positive pump voltage and/or at least one negative pump voltage.

* * * * *